United States Patent
Dalton

(10) Patent No.: US 10,925,197 B2
(45) Date of Patent: Feb. 16, 2021

(54) ELECTRICAL FILTER FOR RESISTIVELY EARTHED SYSTEMS

(71) Applicant: Joy Global Underground Mining LLC, Warrendale, PA (US)

(72) Inventor: Peter M. Dalton, Grove City, PA (US)

(73) Assignee: Joy Global Underground Mining LLC, Warrendale, PA (US)

( * ) Notice: Subject to any disclaimer, the term of this patent is extended or adjusted under 35 U.S.C. 154(b) by 0 days.

(21) Appl. No.: 16/576,846

(22) Filed: Sep. 20, 2019

(65) Prior Publication Data

US 2020/0100404 A1 Mar. 26, 2020

Related U.S. Application Data

(60) Provisional application No. 62/734,392, filed on Sep. 21, 2018.

(51) Int. Cl.
| | |
|---|---|
| H05K 9/00 | (2006.01) |
| H02P 27/04 | (2016.01) |
| H02M 1/32 | (2007.01) |
| H01F 27/24 | (2006.01) |
| H03H 7/01 | (2006.01) |
| H01F 27/30 | (2006.01) |
| H02M 1/12 | (2006.01) |

(52) U.S. Cl.
CPC ........... *H05K 9/0064* (2013.01); *H01F 27/24* (2013.01); *H01F 27/30* (2013.01); *H02M 1/32* (2013.01); *H02P 27/04* (2013.01); *H03H 7/0138* (2013.01); *H02M 2001/123* (2013.01)

(58) Field of Classification Search
CPC ........ H05K 9/0064; H02P 27/04; H02M 1/32; H03H 7/0138; H01F 27/30
USPC ...................................... 361/1, 23
See application file for complete search history.

(56) References Cited

U.S. PATENT DOCUMENTS

| 4,153,923 | A  * | 5/1979  | Graf ................... H02H 11/001 324/510 |
| 4,991,105 | A  * | 2/1991  | Pimental ............... H02H 3/04 324/510 |
| 7,176,648 | B2 * | 2/2007  | Choi .................. B29C 45/7666 318/625 |
| 10,086,703 | B2 * | 10/2018 | Kuttenkuler .......... B60L 15/007 |
| 10,498,309 | B2 * | 12/2019 | Wang ..................... H01F 27/32 |

* cited by examiner

*Primary Examiner* — David Luo
(74) *Attorney, Agent, or Firm* — Michael Best & Friedrich LLP

(57) ABSTRACT

Methods and systems of suppressing ground faults. One system includes a power center including a transformer and a ground fault relay. The system also includes a first motor electrically connected to the power center. The system also includes a first variable speed drive connected to the first motor. The first variable speed drive is configured to vary the speed of the first motor. The system also includes a first common mode choke connected in a series-type connection between the power center and the first variable speed drive. The first common mode choke is configured to suppress a ground current induced by the first variable speed drive.

25 Claims, 9 Drawing Sheets

ELECTRICAL FILTER FOR RESISTIVELY EARTHED SYSTEMS

CROSS-REFERENCE TO RELATED APPLICATION(S)

This application is a non-provisional of and claims priority to U.S. Provisional Patent Application No. 62/734,392, filed on Sep. 21, 2018, the entire contents of which is hereby incorporated by reference.

FIELD

Embodiments described herein relate to an electrical filter for resistively earthed systems.

SUMMARY

Resistively earthed power systems may be used in a variety of mining jurisdictions, such as the United States and Australia. When a variable speed drive ("VSD") is employed in a resistively earthed power system, ground currents (for example, stray ground currents or standing ground currents) may be generated. Ground currents may exceed statutory limits or otherwise be problematic. Ground currents are generally reduced by adding electrical filters. The application of electrical filters in an underground mining environment may be challenging due to, for example, limited space available at a mining face. Another challenge may be that electrical filters include deliberate connections to ground, which are incompatible with resistively earthed electrical systems.

Therefore, embodiments described herein provide an electrical filter that is located away from the mining face and that is compatible with a resistively earthed electrical system. The electrical filter includes a large common mode choke in series with a mining cable located close to a power center, a DCB, or the like and away from the mining face. The embodiments described herein allow medium voltage VSDs to be used in the U.S. with conventional electrical supplies and without an interposing transformer, while complying with the MSHA limit of 125 mA. Additionally, the embodiments described herein allows medium voltage VSDs to be used in Australia with conventional electrical supplies and without an interposing transformer, while complying with QLD/NSW limit of 500 mA.

For example, one embodiment provides an electrical filtering system for use with an industrial machine. The system includes a power center. The power center includes a transformer and a ground fault relay. The system also includes a motor connected to the power center via a mining cable. The system also includes a variable speed drive connected to the motor and configured to vary the speed of the motor. The system also includes a common mode choke connected in a series-type connection between the power center and the variable speed drive. The common mode choke is configured to suppress a ground current. The motor and the variable speed drive are located at a mining face and the common mode choke is located remotely from the mining face.

Another embodiment provides a method of filtering a ground current for use with an industrial machine. A method includes connecting a first common mode choke in a series-type connection between a power center and a first variable speed drive, where the first variable speed drive configured to vary a speed of a first motor electrically connected to the power center. The method also includes suppressing, with the first common mode choke, a ground current induced by the first variable speed drive.

Other aspects of the application will become apparent by consideration of the detailed description and accompanying drawings.

DETAILED DESCRIPTION

Figure 1:
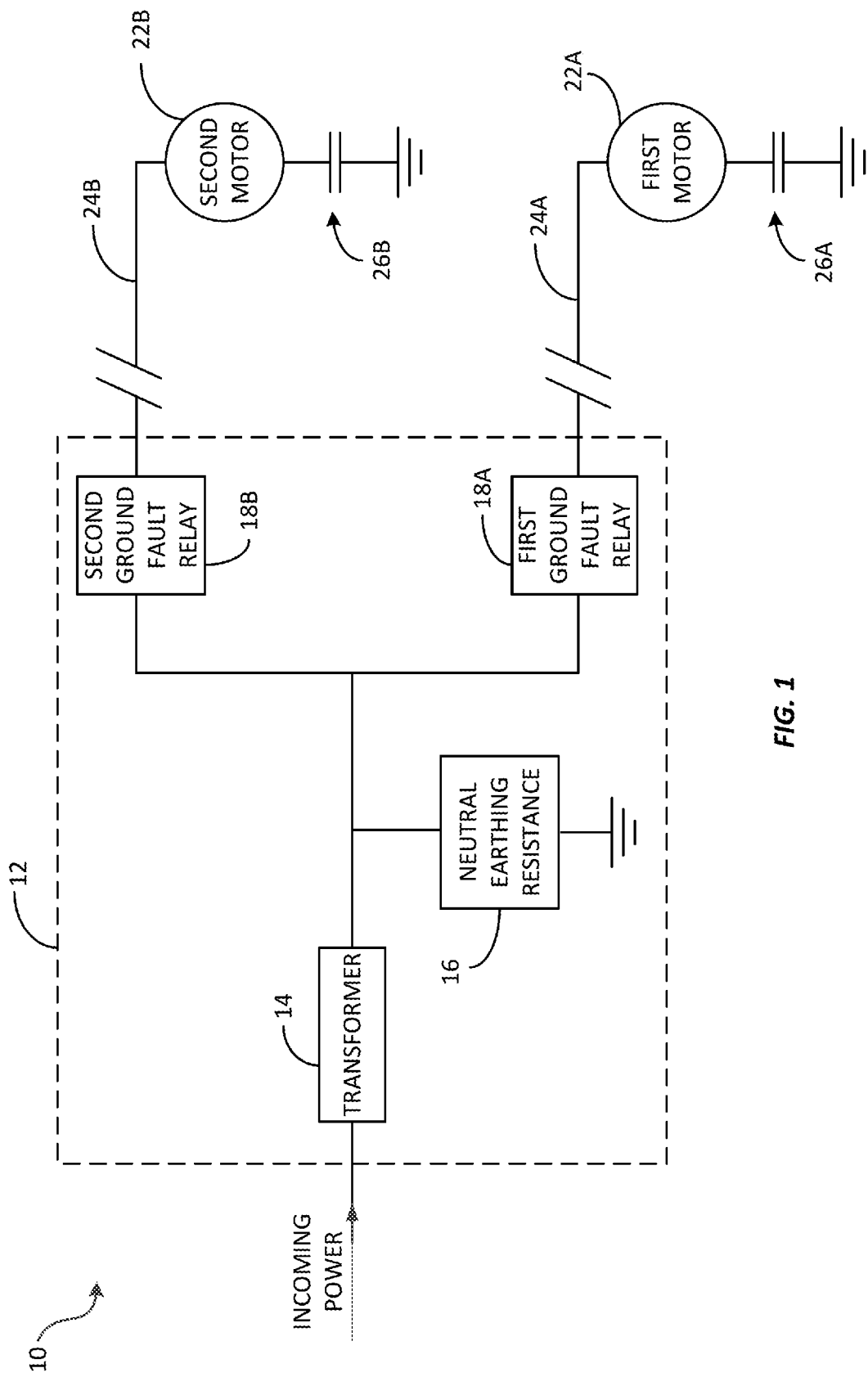
FIG. 1 illustrates an electrical filtering system according to some embodiments.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and may include electrical connections or couplings, whether direct or indirect. Also, electronic communications and notifications may be performed using any known means including wired connections, wireless connections, etc.

It should also be noted that a plurality of hardware and software based devices, as well as a plurality of different structural components may be used to implement the invention. In addition, it should be understood that embodiments of the invention may include hardware, software, and electronic components or modules that, for purposes of discussion, may be illustrated and described as if the majority of the components were implemented solely in hardware.

However, one of ordinary skill in the art, and based on a reading of this detailed description, would recognize that, in at least one embodiment, the electronic based aspects of the invention may be implemented in software (for example, stored on non-transitory computer-readable medium) executable by one or more processors. As such, it should be noted that a plurality of hardware and software based devices, as well as a plurality of different structural components may be utilized to implement the invention. For example, "control units" and "controllers" described in the specification may include one or more electronic processors, one or more memory modules including non-transitory computer-readable medium, one or more input/output interfaces, and various connections (for example, a system bus) connecting the components.

Electricity is reticulated throughout mines to a power face and other equipment. A hazard associated with electricity in mines is unintended flow of current to ground. It is standard practice to limit prospective ground current by resistive earthing of the electrical system and to utilize protective devices (for example, relays) that isolate (or trip) equipment when ground current exceeds a certain value. For example, U.S. practice is that medium voltage motors and shearing machines be limited to 500 mA ground current and trip at no more than 125 mA ground current. Although the embodiments described herein are described with respect to medium voltage equipment (for example, 3300V or 4160 V), the embodiments described herein may be implemented on equipment operating with other voltages.

FIG. 1 illustrates an electrical filtering system 10 according to some embodiments. As illustrated in FIG. 1, the electrical filtering system 10 includes a power center 12. The power center 12 includes a transformer 14, a neutral earthing resistance 16, a first ground fault relay 18A, and a second ground fault relay 18B. The mine electrical system 10 also includes a first motor 22A and a second motor 22B. The first motor 22A and the second motor 22B are connected to the power center 12 via a first mining cable 24A and a second mining cable 24B, respectively. In some embodiments, the first motor 22A and the second motor 22B are positioned away from the power center 12 (illustrated as a break in the first mining cable 24A and the second mining cable 24B). For example, the first motor 22A and the second motor 22B may be positioned at a distance of over 500 meters away from the power center 12. Accordingly, in some embodiments, the first motor 222A and the second motor 22B are positioned remotely from the power center 12.

In some embodiments, the electrical filtering system 10 employs three sinusoidal phases (for example, approximately 50 Hz or approximately 60 Hz). The phases may be balanced with regard to ground in that the average or common mode voltage to ground is zero (or approximately near zero). Due to a proximity of phases to ground, stray capacitances 26A and 26B from the phases to ground exist. However, a net current to ground may be low because: (a) the ground currents from each phase tend to add to zero due to the voltages being balanced; and (b) the reactance of the capacitances are high at the relatively low frequencies of, for example, 50 Hz or 60 Hz.

A common electrical load in a mine is an induction motor, such as the first motor 22A and the second motor 22B. For example, a longwall mining system may have two or three armored faced conveyor ("AFC") motors and one Beam Stage Loader ("BSL") motor. The speed of this type of motor (for example, the first motor 22A and the second motor 22B) may be proportional to the line frequency. The speed of the first motor 22A and the second motor 22B may be varied using a corresponding variable speed drive ("VSD"). A VSD is a power electronic converter that generates voltages at a variable frequency. However, a typical VSD generates voltages that are not balanced and include high frequency components (for example, up to 1 MHz).

Figure 2:
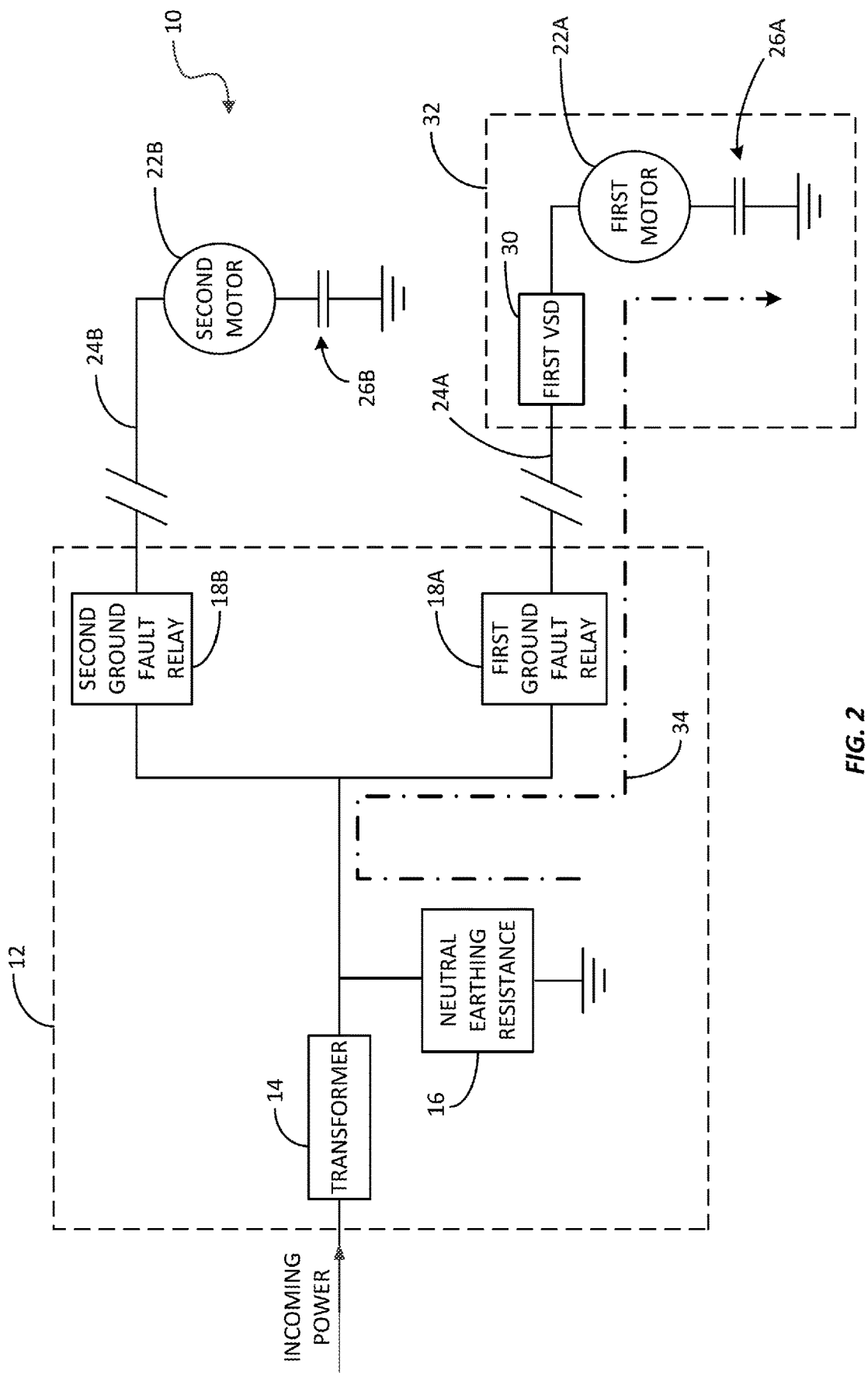
FIG. 2 illustrates the electrical filtering system of FIG. 1 with a variable speed drive according to some embodiments.

As illustrated in FIG. 2, a first VSD 30 may be included in the electrical filtering system 10. For example, the first VSD 30 may be associated with the first motor 22A. The first VSD 30 and the first motor 22A may be contained within a machine enclosure 32. As noted above, when a VSD is employed in a resistively earthed power system, such as the electrical filtering system 10, a ground current (for example, a standing ground current) may be generated. For example, as illustrated in FIG. 2, when the first VSD 30 is introduced into the electrical filtering system 10, a high frequency, common mode voltage generated by the first VSD 30 induces a ground current (illustrated by a dashed line marked with reference numeral 34) through the stray capacitance 26B. In some cases, the standing ground current of a VSD driven motor (for example, the second motor 22B of FIG. 2) may be several hundred milliamps. Such a current value may exceed regulated limits, be problematic due to electromagnetic compatibility ("EMC"), or a combination thereof.

Figure 3:
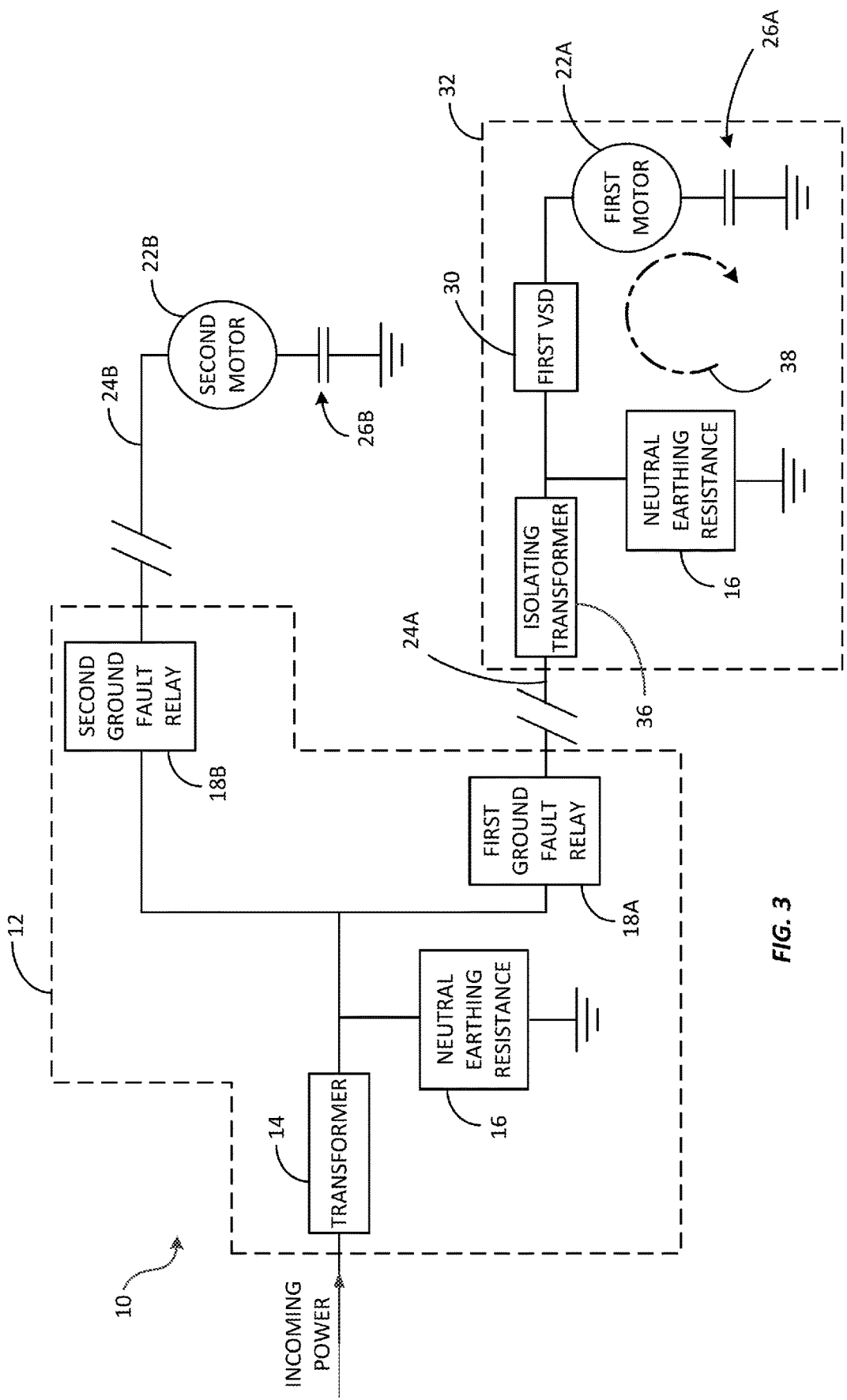
FIG. 3 illustrates the electrical filtering system of FIG. 1 with an isolating transformer according to some embodiments.

A transformer passes differential mode current, not common mode current. Thus, a transformer may be used in various ways to restrict the flow of ground current induced (or generated) by the first VSD 30. For example, as illustrated in FIG. 3, an isolating transformer 36 may be included in the mining enclosure 32 close to the mining face. In some embodiments, the isolating transformer 36 localizes a ground current (illustrated by a dashed line marked with reference numeral 38). As illustrated in FIG. 3, the isolating transformer 36 is located immediately on a line side of the first VSD 30. The configuration illustrated in FIG. 3 confines the ground current to a smaller region, such as within a single explosion proof enclosure (for example, the mining enclosure 32), which may be accepted by regulations.

In some embodiments, the isolating transformer 36 is integral to the first VSD 30. For example, the mining system may implement a low voltage VSD (for traction) supplied by an onboard, step down transformer. However, such solutions are undesirable as the transformer is very large, particularly for an AFC application where the power level may be more than 1 MW.

Figure 4A:
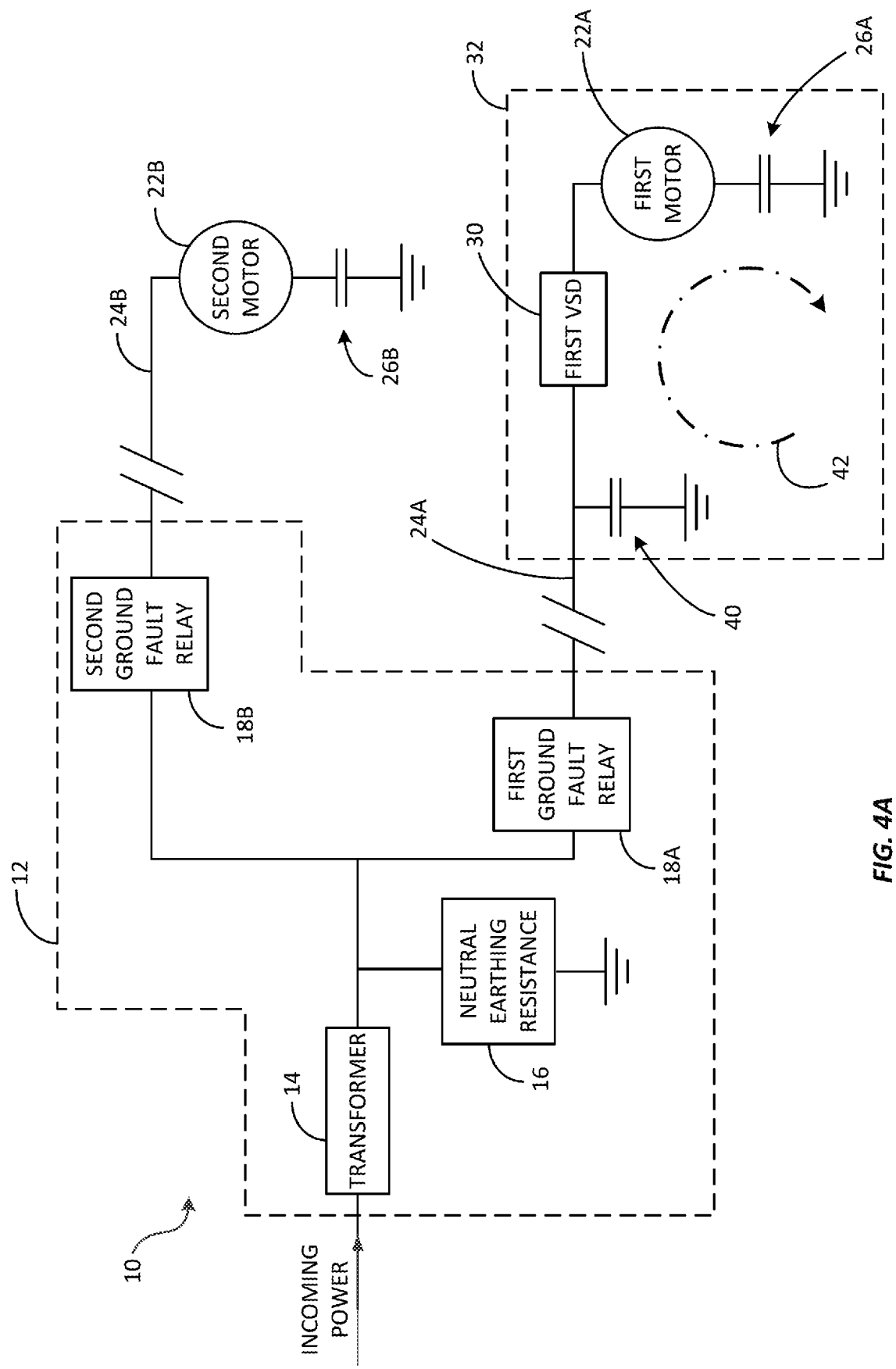
FIG. 4A illustrates the electrical filtering system of FIG. 1 with a capacitive filter connected to ground according to some embodiments.

FIG. 4A illustrates the use of a capacitive filter 40 (connected to ground). The capacitive filter 40 is positioned close to the mining face to localize the ground current (illustrated by a dashed line marked with reference numeral 42). In particular, as illustrated in FIG. 4A, an explicit, balanced capacitor network (for example, the capacitive filter 40) is connected from the three phases to ground just to a line side of the first VSD 30 (similar to the positioning of the isolating transformer 36 of FIG. 3). This configuration provides a path to ground for the ground current induced (or generated) by the first VSD 30. In some embodiments, this approach does not prevent the flow of ground current, but confines the ground current to a smaller region, such as a signal explosion proof enclosure (for example, the mining enclosure 32).

Figure 4B:
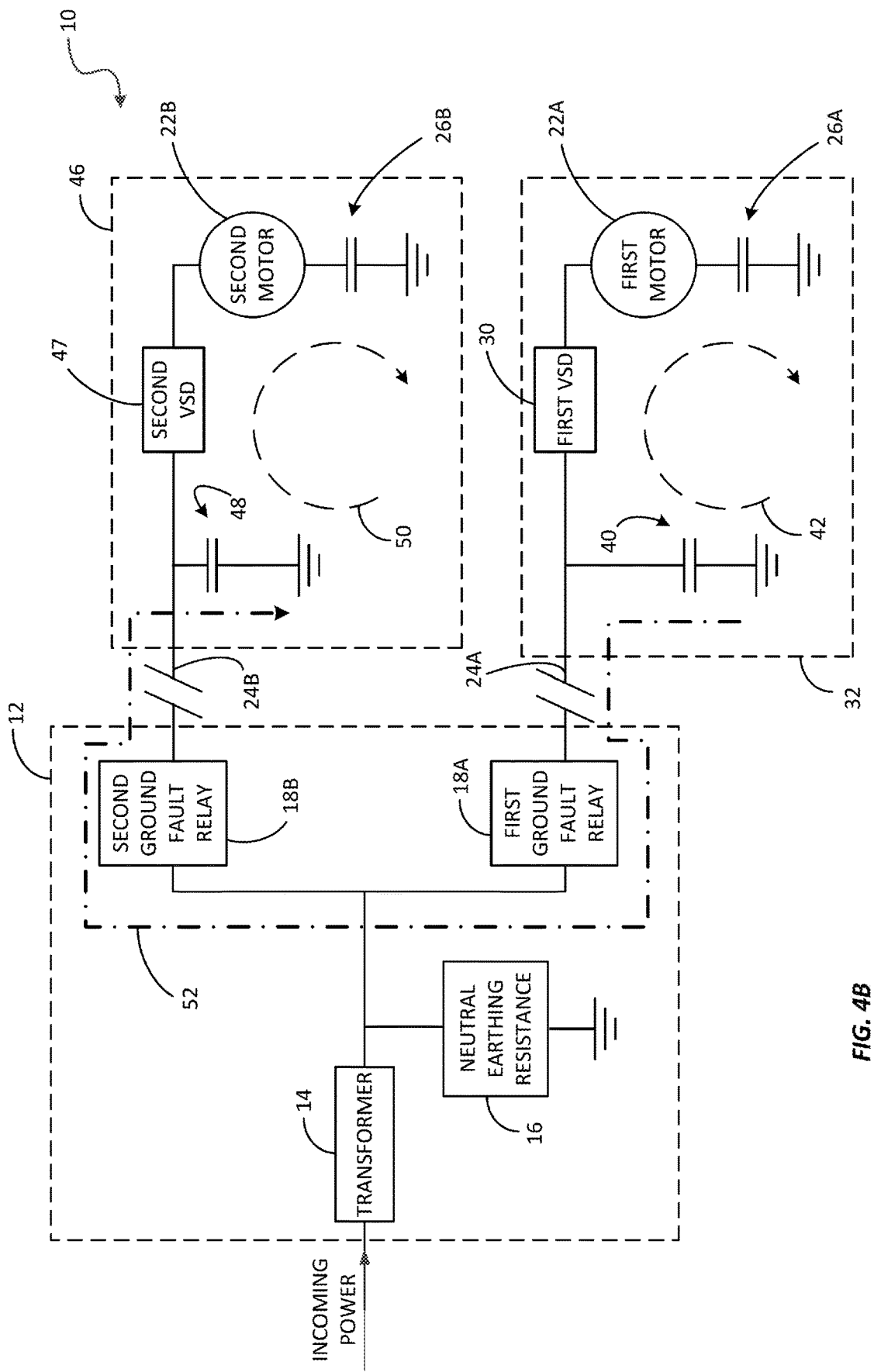
FIG. 4B illustrates the electrical filtering system of FIG. 1 with a second variable speed drive and a capacitive filter according to some embodiments.

FIG. 4B illustrates a configuration of the electrical filtering system 10 in which more than one VSD is operated from the same supply. In particular, FIG. 4B illustrates a second machine enclosure 46 that includes a second VSD 47, the second motor 22B, and a second capacitive filter 48. As illustrated in FIG. 4B, a ground current (illustrated as a dashed line marked with reference numeral 50) flows through the second capacitive filter 48 to ground via the second motor 22B. In the configuration illustrated in FIG. 4B, a ground current induced by one VSD may return to ground through a capacitive filter of the other VSD. For example, as illustrated in FIG. 4B, a ground current (illustrated as a dashed line marked with reference numeral 52) induced by the first VSD 30 may return to ground through the second capacitive filter 48 of the second VSD 47. Similarly, although not illustrated, a ground current induced by the second VSD 47 may return to ground through the first capacitive filter 40 of the first VSD 30. Accordingly, when the electric filtering system 10 includes multiple VSDs operated from the same supply, such as the first VSD 30 and the second VSD 47, a ground current induced by one of the VSDs (for example, the ground current illustrated by the dashed line marked with reference numeral 52) is no longer confined to a small region (as illustrated with the dashed line marked with reference numeral 42).

Figure 4C:
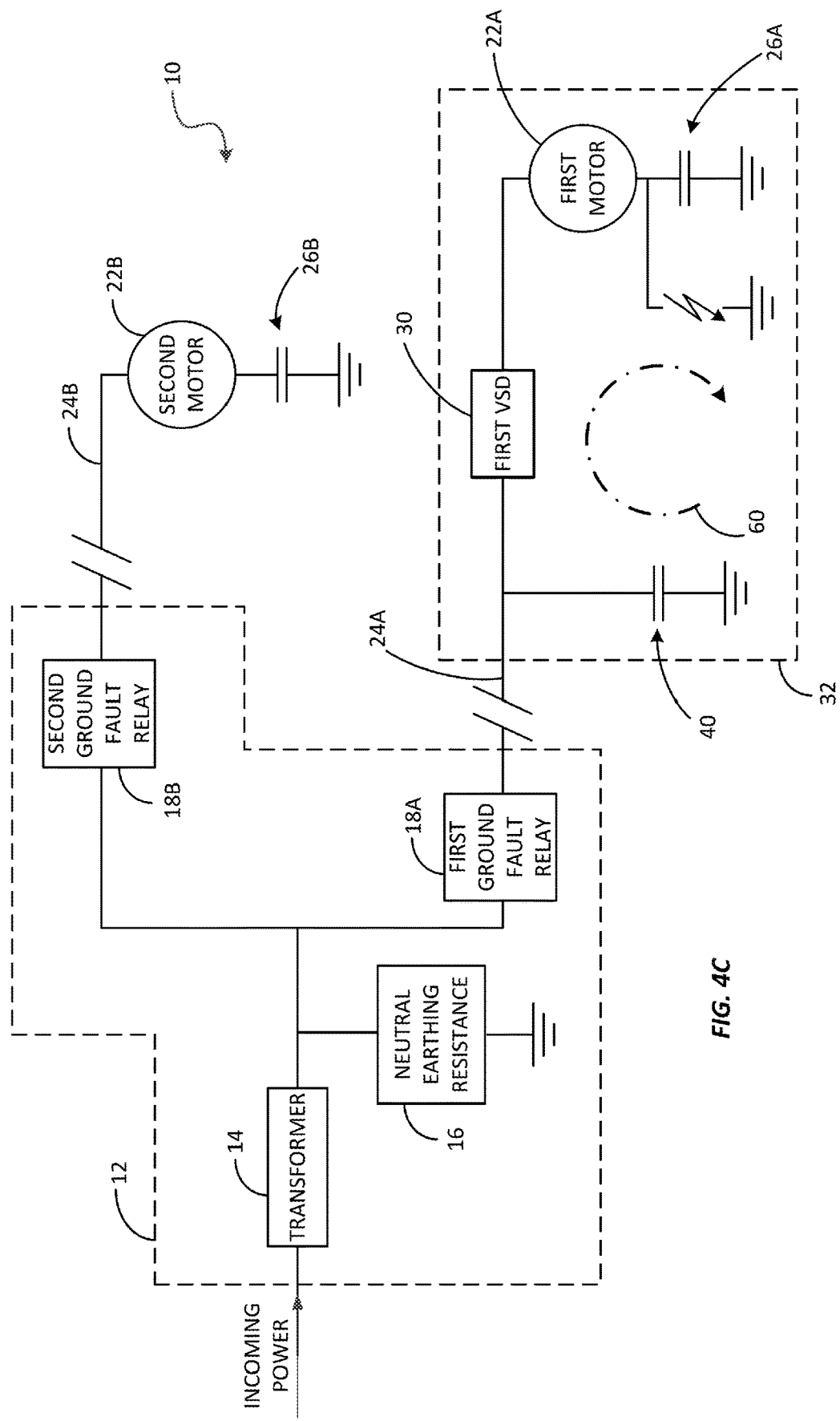
FIG. 4C illustrates the electrical filtering system of FIG. 1 showing a ground fault according to some embodiments.

Alternatively or in addition, as illustrated in FIG. 4C, when the capacitive filter 40 is used, a ground fault on the first motor 22A may cause a ground current (illustrated as a dashed line marked with reference numeral 60) to flow undetected by the first ground fault relay 18A and not limited by the neutral earthing resistance 16. In other words, a ground current in a ground fault is no longer limited by the neutral earthing resistor 16 as the capacitive filter 40 provides a low impedance (at high frequency) path to ground.

To overcome these and other problems, embodiments described herein provide for a series-type connected common mode choke ("CMC") included in the electrical filtering system 10 for suppressing (or filtering) ground currents.

Figure 5:
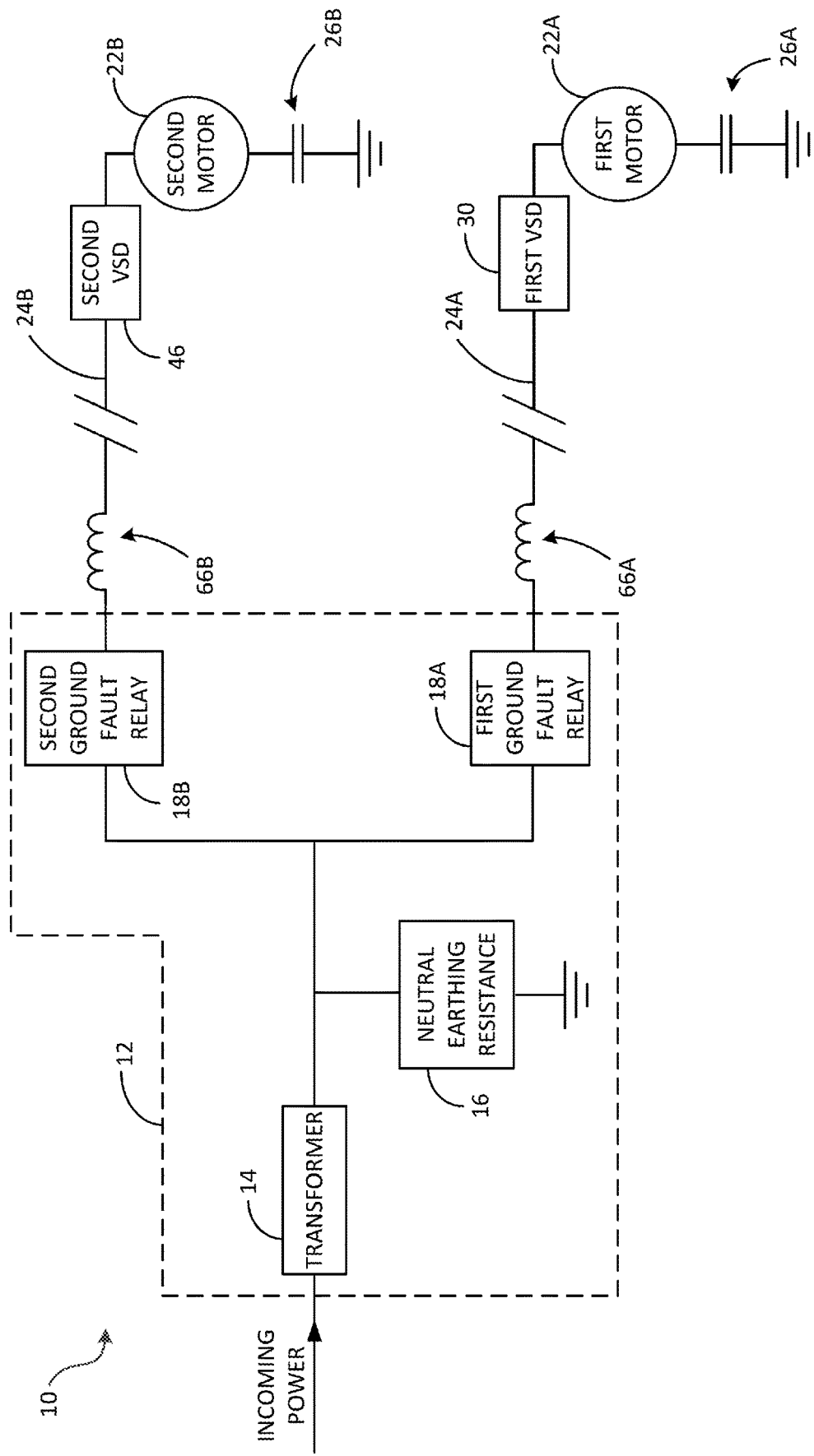
FIG. 5 illustrates the electrical filtering system of FIG. 1 with common mode chokes positioned in a series-type connection with mining cables according to some embodiments.

For example, FIG. 5 illustrates the electrical filtering system 10 with a first CMC 66A and a second CMC 66B. The first CMC 66A and the second CMC 66B may be connected to the power center 12 via the first mining cable 24A and the second mining cable 24B, respectively. In particular, as illustrated in FIG. 5, the first CMC 66A and the second CMC 66B are connected in a series-type connection. For example, the first CMC 66A is connected in a series-type connection between the power center 12 and the first VSD 30 while the second CMC 66B is connected in a series-type connection between the power center 12 and the second VSD 30. In some embodiments, the first CMC 66A and the second CMC 66B are positioned away from a mining face (illustrated as a break in the first mining cable 24A and the second mining cable 24B). Accordingly, in some embodiments, the first CMC 66A and the second CMC 66B are positioned remotely from the mining face (for example, the first VSD 30, the first motor 22A, the second VSD 46, the second motor 22B, and the like). In other words, the first CMC 66A, the second CMC 66B, or a combination thereof are positioned near a source of power supply (for example, the power center 12) and away from a mining face.

Figure 6:
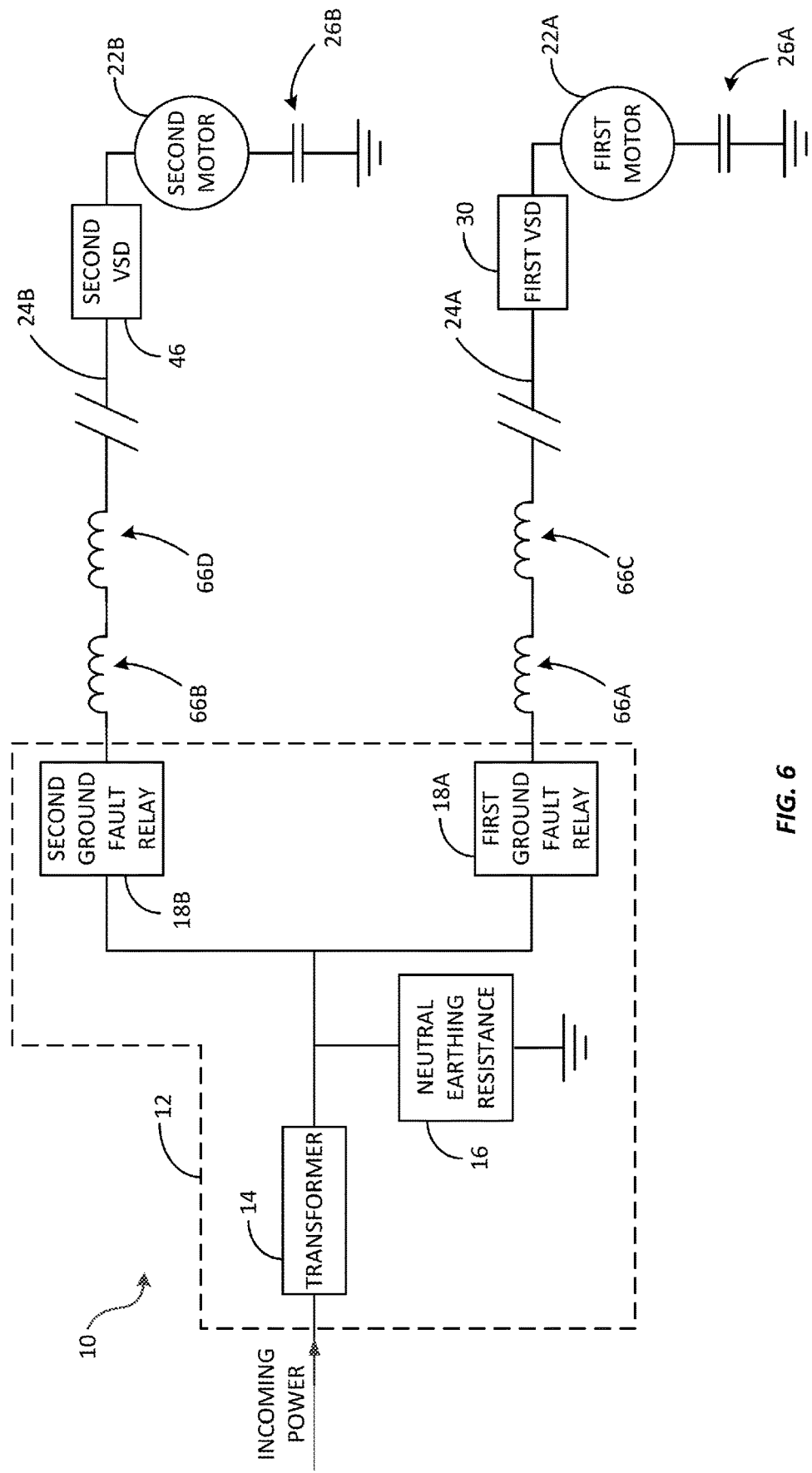
FIG. 6 illustrates the mine electrical system of FIG. 5 with multiple common mode chokes positioned in a series-type connection with mining cables according to some embodiments.

In some embodiments, more than one CMC is connected in a series-type connection. For example, as illustrated in FIG. 6, a third CMC 66C is connected in a series-type connection with the first CMC 66A and a fourth CMC 66D is connected in a series-type connection with the second CMC 66B. Connecting multiple CMCs in a series-type connection may provide an increased suppression of the ground currents. For example, the series combination of the first CMC 66A and the third CMC 66C may provide an increased suppression of the ground current induced by the first VSD 30 than just the first CMC 66A.

Figure 7:
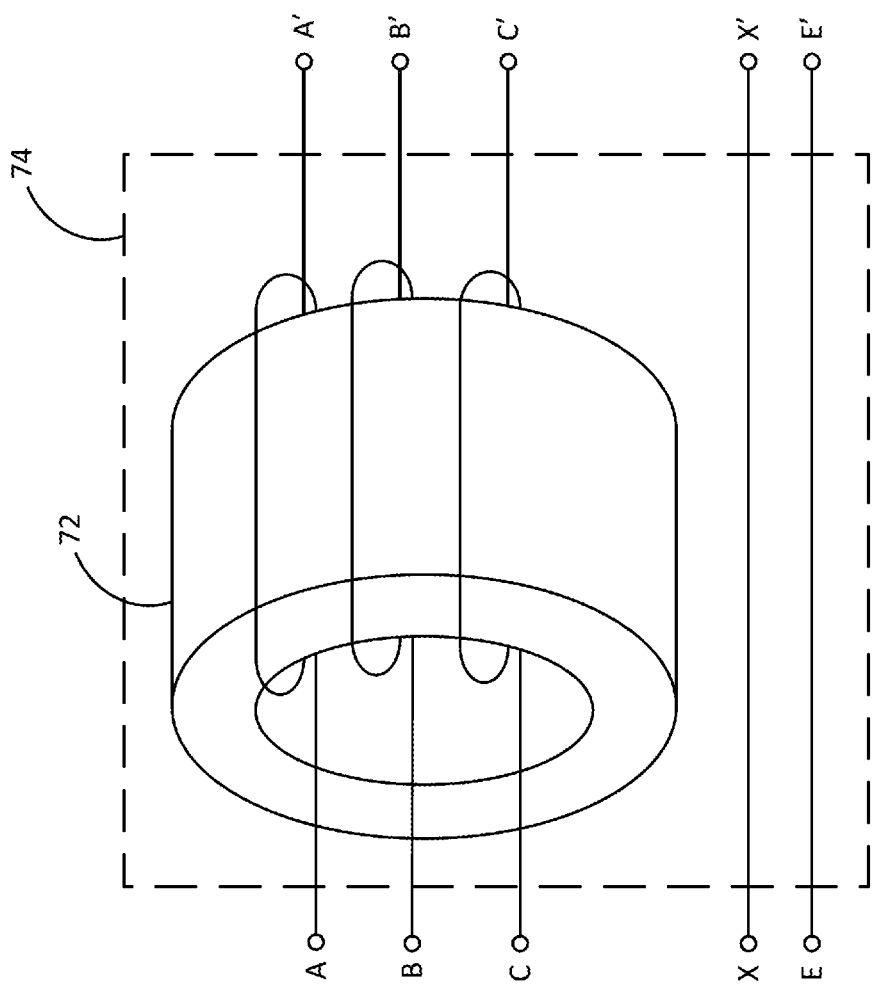
FIG. 7 illustrates a configuration of a common mode choke according to some embodiments.

In some embodiments, a CMC (for example, the first CMC 66A, the second CMC 66B, the third CMC 66C, and the fourth CMC 66D) is a multi-winding inductor that inserts impedance only for current common to all conductors. For example, as illustrated in FIG. 7, this may be achieved with three identical windings, one for each phase, such that magnetic induction is only generated proportional to the sum of the three currents, which is normally a low value. For example, as illustrated in FIG. 7, three identical windings A, B, and C are wound around a magnetic core 72 within an enclosure 74. The magnetic core 72 may include a closed loop of ferromagnetic materials. In some embodiments, the magnetic core 72 includes multiple magnetic cores stacked in parallel. As illustrated in FIG. 7, the three identical windings A, B, and C may be passed through the magnetic core 72 in an identical fashion. For example, the three identical windings A, B, and C may be passed through the magnetic core 72 in the same direction. Alternatively or in addition, the three identical windings A, B, and C may be wound around the magnetic core 72 with a same number of turns.

In some embodiments, the enclosure 74 includes one or more additional conductors. For example, as illustrated in FIG. 7, the enclosure 74 may include an ancillary conductor X, such as a pilot wire, and a ground conductor E, such as a ground wire. As illustrated in FIG. 7, the ground conductor E and the ancillary conductor X pass from a line side connector to a load side connector. However, the ground conductor E and the ancillary conductor X make no connection to the CMC (for example, are not wound around the magnetic core 72). A chassis of the CMC may be connected to the ground conductor E but no other ground connection is made.

When an impedance of the first CMC 66A, the second CMC 66B, or a combination thereof is sufficiently large, one or more ground currents may be suppressed. While the first CMC 66A, the second CMC 66B, or a combination thereof may be physically large in size, the first CMC 66A and the second CMC 66B are inserted in series (via a series-type connection), as noted above. Accordingly, the first CMC 66A, the second CMC 66B, or a combination thereof may be located anywhere along a corresponding mining cable (for example, the first mining cable 24A and the second mining cable 24B), including remotely from a mining face, where space is ample and regulations are more permissive. In some embodiments, the first CMC 66A, the second CMC 66B, or a combination thereof are incorporated into other existing enclosures, such as an enclosure housing the transformer 14 and the ground fault relays 18A and 18B (for example, an enclosure of the power center 12).

It should be understood that although the embodiments described herein are described with respect to AFC motors and BSL motors, the embodiments described herein may be implemented on other underground mining equipment, surface mining equipment, non-mining equipment, and the like.

The phrase "series-type connection" as used herein refers to a circuit arrangement where the described elements are arranged, in general, in a sequential fashion such that the output of one element is coupled to the input of another, but the same current may not pass through each element. For example, in a series-type connection, one or more additional circuit elements may be connected in parallel with one or more of the elements in the series-type connection. Furthermore, one or more additional circuit elements may be connected at nodes in the series-type connection such that branches in the circuit are present. Therefore, elements in a series-type connection do not necessarily form a true "series circuit."

Additionally, the phrase "parallel-type connection" as used herein refers to a circuit arrangement where the described elements are arranged, in general, in a manner where one element is connected to another element, such that the circuit forms a parallel branch of the circuit arrangement. In such a connection, a potential difference across each of the individual elements of the circuit may not be the same. For example, in a parallel-type connection of the circuit, two circuit elements that are in parallel with one another may be connected in series with one or more additional elements of the circuit. Therefore, a circuit in a parallel-type connection may include elements that do not necessarily individually form a true "parallel circuit."

Thus, the application provides, among other things, a system and method for suppressing ground currents as described above. The system and methods described herein also enable the use of compact VSDs at a mining face in a regulatory compliant and cost effective manner. Various features and advantages of the application are set forth in the following claims.

What is claimed is:

1. An electrical filtering system for use with an industrial machine, the system comprising:
a power center including a transformer and a ground fault relay;
a first motor electrically connected to the power center;
a first variable speed drive connected to the first motor, the first variable speed drive configured to vary the speed of the first motor; and
a first common mode choke connected in a series-type connection between the power center and the first variable speed drive, the first common mode choke configured to suppress a ground current induced by the first variable speed drive, wherein the common mode choke includes a plurality of windings, each winding having a first end coupled a power supply line of the power center and a second end coupled to the variable speed drive.

2. The system of claim 1, further comprising:
a second motor electrically connected to the power center;
a second variable speed drive connected to the second motor, the second variable speed drive configured to vary the speed of the second motor; and
a second common mode choke connected in a series-type connection between the power center and the second variable speed drive, the second common mode choke configured to suppress a ground current induced by the second variable speed drive.

3. The system of claim 2, further comprising:
a fourth common mode choke connected in a series-type connection with the second common mode choke, the fourth common mode choke configured to increase the suppression of the ground current induced by the second variable speed drive.

4. The system of claim 1, further comprising:
a third common mode choke connected in a series-type connection with the first common mode choke, the third common mode choke configured to increase the suppression of the ground current induced by the first variable speed drive.

5. The system of claim 1, wherein the first common mode choke is included in the power center.

6. The system of claim 1, wherein the first common mode choke is positioned remotely from a mining face associated with the first motor and the first variable speed drive.

7. The system of claim 1, wherein the first common mode choke is positioned at a first distance from the power center and at a second distance from the first variable speed drive, wherein the second distance is greater than the first distance.

8. The system of claim 1, wherein the first common mode choke is a multi-winding inductor configured to insert impedance for current common to all conductors.

9. The system of claim 8, wherein the first common mode choke includes three identical windings.

10. The system of claim 1, wherein the first common mode choke includes a magnetic core with three windings within an enclosure.

11. The system of claim 10, wherein the magnetic core includes multiple magnetic cores stacked in parallel.

12. The system of claim 10, wherein the three windings are wound around the magnetic core in the same direction.

13. The system of claim 10, wherein the three windings are wound around the magnetic core with a same amount of turns.

14. The electrical filtering system of claim 1, further comprising a ground line having a line side connector and a load side connector and providing a connection between the power center and the variable speed drive separate from connections provided by the plurality of windings, wherein the common mode choke is configured to suppress the ground current in the ground line.

15. A method of filtering ground current for use with an industrial machine, the method comprising:
connecting a first common mode choke in a series-type connection between a power center and a first variable speed drive, the first variable speed drive configured to vary a speed of a first motor electrically connected to the power center; and
suppressing, with the first common mode choke, a ground current induced by the first variable speed drive;
wherein the common mode choke includes a plurality of windings, each winding having a first end coupled a power supply line of the power center and a second end coupled to the variable speed drive.

16. The method of claim 15, further comprising:
connecting a second common mode choke in a series-type connection between the power center and a second variable speed drive, the second variable speed drive configured to vary a speed of a second motor electrically connected to the power center; and
suppressing, with the second common mode choke, a ground current induced by the second variable speed drive.

17. The method of claim 16, further comprising:
connecting a fourth common mode choke in a series-type connection with the second common mode choke, the fourth common mode choke configured to increase the suppression of the ground current induced by the second variable speed drive.

18. The method of claim 15, further comprising:
connecting a third common mode choke in a series-type connection with the first common mode choke, the third common mode choke configured to increase the suppression of the ground current induced by the first variable speed drive.

19. The method of claim 15, wherein connecting the first common mode choke in a series-type connection between the power center and the first variable speed drive includes positioning the first common mode choke in the power center.

20. The method of claim 15, wherein connecting the first common mode choke in a series-type connection between the power center and the first variable speed drive includes positioning the first common mode choke remote from a mining face associated with the first motor and the first variable speed drive.

21. The method of claim 15, wherein connecting the first common mode choke in a series-type connection between the power center and the first variable speed drive includes positioning the first common mode choke at a first distance from the power center and at a second distance from the first variable speed drive, wherein the second distance is greater than the first distance.

22. An electrical filtering system for use with an industrial machine, the system comprising:
   a power center including a transformer and a ground fault relay;
   a first motor electrically connected to the power center;
   a second motor electrically connected to the power center;
   a first variable speed drive connected to the first motor, the first variable speed drive configured to vary the speed of the first motor;
   a second variable speed drive connected to the second motor, the second variable speed drive configured to vary the speed of the second motor;
   a first common mode choke connected in a series-type connection between the power center and the first variable speed drive, the first common mode choke configured to suppress a ground current induced by the first variable speed drive; and
   a second common mode choke connected in a series-type connection between the power center and the second variable speed drive, the second common mode choke configured to suppress a ground current induced by the second variable speed drive.

23. A method of filtering ground current for use with an industrial machine, the method comprising:
   connecting a first common mode choke in a series-type connection between a power center and a first variable speed drive, the first variable speed drive configured to vary a speed of a first motor electrically connected to the power center;
   connecting a second common mode choke in a series-type connection between the power center and a second variable speed drive, the second variable speed drive configured to vary a speed of a second motor electrically connected to the power center;
   suppressing, with the first common mode choke, a ground current induced by the first variable speed drive; and
   suppressing, with the second common mode choke, a ground current induced by the second variable speed drive.

24. An electrical filtering system for use with an industrial machine, the system comprising:
   a power center including a transformer and a ground fault relay;
   a first motor electrically connected to the power center;
   a first variable speed drive connected to the first motor, the first variable speed drive configured to vary the speed of the first motor;
   a first common mode choke connected in a series-type connection between the power center and the first variable speed drive, the first common mode choke configured to suppress a ground current induced by the first variable speed drive; and
   a second common mode choke connected in a series-type connection with the first common mode choke, the second common mode choke configured to increase the suppression of the ground current induced by the first variable speed drive.

25. A method of filtering ground current for use with an industrial machine, the method comprising:
   connecting a first common mode choke in a series-type connection between a power center and a first variable speed drive, the first variable speed drive configured to vary a speed of a first motor electrically connected to the power center;
   connecting a second common mode choke in a series-type connection between the first common mode choke and the first variable speed drive;
   suppressing, with the first common mode choke, a ground current induced by the first variable speed drive; and
   increasing, with the second common mode choke, the suppression of the ground current induced by the first variable speed drive.

* * * * *